United States Patent [19]

Birkner et al.

[11] Patent Number: 4,789,951

[45] Date of Patent: Dec. 6, 1988

[54] PROGRAMMABLE ARRAY LOGIC CELL

[75] Inventors: John M. Birkner, Sunnyvale; Danesh M. Tavana, San Jose; Andrew K. Chan, Milpitas; Sing Y. Wong, Sunnyvale, all of Calif.

[73] Assignee: Advanced Micro Devices, Inc., Sunnyvale, Calif.

[21] Appl. No.: 864,185

[22] Filed: May 16, 1986

[51] Int. Cl.⁴ .................. G06F 7/38; H03K 19/173
[52] U.S. Cl. .................................... 364/716; 307/465
[58] Field of Search ..................... 364/716; 307/465; 340/825.83, 825.87

[56] References Cited

U.S. PATENT DOCUMENTS 4,124,489 11/1978 Birkner et al. ................... 364/716
4,644,192 2/1987 Fisher ............................... 307/465
4,677,318 6/1987 Veenstra .......................... 364/716
4,684,830 8/1987 Tsui et al. ........................ 307/465

Primary Examiner—Gary V. Harkcom
Assistant Examiner—Long Thanh Nguyen
Attorney, Agent, or Firm—Alan H. MacPherson; Paul J. Winters; Norman R. Klivans

[57] ABSTRACT

A programmable array logic cell 60 including a sum-of-products array having a single OR gate 70 for providing a sum signal, and including an XOR gate 80 for combining the sum signal with a product signal provided by an AND gate 78 from selected array input and/or feedback signals. The product signal can be the previous state output signal Q for a JK flip flop configuration, or a forced high or low signal for other configurations for programmable output signal polarity.

5 Claims, 3 Drawing Sheets

PROGRAMMABLE ARRAY LOGIC CELL

BACKGROUND OF THE INVENTION

This invention relates to electronic circuits, and more specifically to a programmable logic array macro cell, specialized for certain classes of functions.

A programmable logic array (PLA) is a general purpose integrated circuit (IC) device which, at some stage of its manufacture, is customized or programmed to execute a userdefined logical function. As illustrated in FIG. 1, a conventional PLA cell 10 has input lines I1 through IM which are programmably connectable to the input lines of AND gates AG1 through AGR, which are arranged in a row or first "level" of logic called an AND plane, and which form logical product terms P1 through PR. AND plane product term output lines are programmably connectable to OR gates OG1 through OGN, which are arranged in a column or second level called an OR plane, and which provide logical sum-of-product signals on OR plane output lines S1 through SN. Some of OR plane output lines S1-SN may be coupled through clocked registers 25, 26 to return signals on feedback lines 27, 28 to AND plane input lines for array cell 10 to execute sequential logic operations.

To program array cell 10, the user defines gate input line connections, by way of a pattern for a mask used in a manufacturing step for a mask-programmed PLA, or by way of a "fuse plot" used by a programming machine to blow fuses in a field programmable logic array (FPLA) after manufacture.

PLAs are designed with various ratios of quantities of AND gates, OR gates, and programmable connections in input lines to the logic planes. One type of PLA, a programmable array logic device, for example a "PAL" (registered trademark of Monolithic Memories, Inc.) device, has array input lines programmably connectable to AND plane input lines, and AND plane product output lines fixedly connected to OR plane input lines, with D-type flip-flop output registers. Although D-type flip-flops are powerful, large state machine applications often require the more versatile JK flip-flop functions, which starts with a present state value Qo, upon which two input signal values J and K operate to produce a next state value Qo', according to the following table 1:

TABLE 1

| J | K | Qo' |
|---|---|---|
| 0 | 0 | Qo |
| 0 | 1 | 0 |
| 1 | 0 | 1 |
| 1 | 1 | $\overline{Qo}$ |

The JK function is commonly expressed in a first form as $Qo'=J\overline{Qo}+\overline{K}Qo$. It can be implemented by a circuit 30, Fig. 2, in which input signal K is inverted by inverter 34 into signal $\overline{K}$ and applied with previous state feedback signal Qo to AND gate 36, while signal Qo is inverted by inverter 33 and applied with input signal J to AND gate 35. AND gates 35 and 36 apply product signals $J\overline{Qo}$ and $\overline{K}Qo$, respectively, to the input lines of OR gate 37, which forms next state signal $Qo'=J\overline{Qo}+\overline{K}Qo$.

The J and/or K signals received by circuit 30 input lines 31 and 32 can in turn be products J1 and K1 of sets of input signals J1a through J1z, and K1a through K1z, respectively, provided by AND gates 11 and 14, FIG. 2.

Furthermore, signals J and K can be logical sums of product signals J1 through Jj, and K1 through Kk, which are formed from respective subsets of input signals (a,b, ..., z) by AND gates 11 through 16 and OR gates 17 and 18 in a PLA device 10, FIG. 2, without output registers 25 and 26 of FIG. 1.

However, an IC 20, FIG. 2, adapted to execute the JK flip-flop function by using a logic array 10 with OR plane output lines connected to a dedicated JK flip-flop circuit 30 cannot provide output signals for functions other than the JK flip-flop function, which conflicts with the IC design goal of making maximum use of minimum circuit elements.

The capacity to be programmed initially to execute other functions is preserved by a PLA device in which a sum-of-products array performs the JK function and stores next state signal Qo' in a D-type flip-flop for output and/or feedback. However, an AND-OR-INVERT array implementation of the JK function $Qo'=J\overline{Qo}+\overline{K}Qo$ requires passing signal K (or its factors Ka ... Kz) through the array in a first cycle to obtain $\overline{K}$, inverting signal K, and then passing inverse signal $\overline{K}$ through the array again in a second cycle, or through a second equivalent array, with signals J (or its factors Ja ... Jz), Qo, and $\overline{Qo}$, to obtain next state signal Qo'. Such a use of multiple cycles through an array, or of multiple arrays, is inefficient.

If K is a product of z factors Ka through Kz, $K=(Ka*Kb* ... *Kz)$, then, by DeMorgan's laws, $\overline{K}=(\overline{Ka}+\overline{Kb}+ ... +\overline{Kz})$, and $\overline{K}Qo=(\overline{Ka}*Qo+\overline{Kb}*Qo+ ... +\overline{Kz}*Qo)$. Based upon these identities, the JK flip-flop equation can be expressed in an equivalent second form, $Qo'=(J\overline{Qo}+\overline{Ka}Qo+\overline{Kb}Qo+ ... +\overline{Kz}Qo)$. However, a circuit with fewer than z product terms cannot implement this second form of the JK function.

The JK flip-flop function can also be expressed in an equivalent third form: $Qo'=Qo\oplus(J\overline{Qo}+KQo)$. This form avoids the inconvenience of obtaining $\overline{K}$, by using an exclusive OR (XOR) gate.

Programmable array logic circuits as described in U.S. Pat. No. 4,124,989 to Birkner and Chua and assigned to Monolithic Memories, Inc. are partitioned into cells which include an AND-OR array with a D type flip-flop output register. In some embodiments of that patent, cells include an XOR gate between OR gate output terminals and the D flip-flop input terminal. These prior art XOR cells, with multiple AND gates feeding each of two OR gates, are suited to implement bit-carrys for arithmetic operations. The third equivalent form of the JK function can be implemented by driving the XOR gate with the previous state output signal Qo applied, without any logical operation, through one of the OR gates and one associated AND gate, but this use of half the XOR cell is inefficient.

There remains a need, therefore, for a programmable array logic cell design optimized for uses such as a flip-flop, a counter, a state machine, or a parity detector.

SUMMARY

This invention provides a programmable array logic macro cell optimized to implement the JK flip-flop function in the form $Qo'=Qo\oplus(J\overline{Ko}+KQo)$. Preferably, the cell can be programmed to use j+k= two to eight subsets of cell input and/or feedback signals I1 through I22 or their complements, which are ANDed together to form product signals, which are in turn ORed together to form a sum signal. For the JK function, the sum signal and the previous state output signal Qo are applied to two input terminals of an XOR gate, which produces present state signal Qo'.

Alternatively, the cell can be programmed to implement a one bit counter, a Mealy or Moore type state machine, a parity detector, or programmed to implement other functions producing combinatorial or D-type registered output signals.

DETAILED DESCRIPTION

Figure 1:
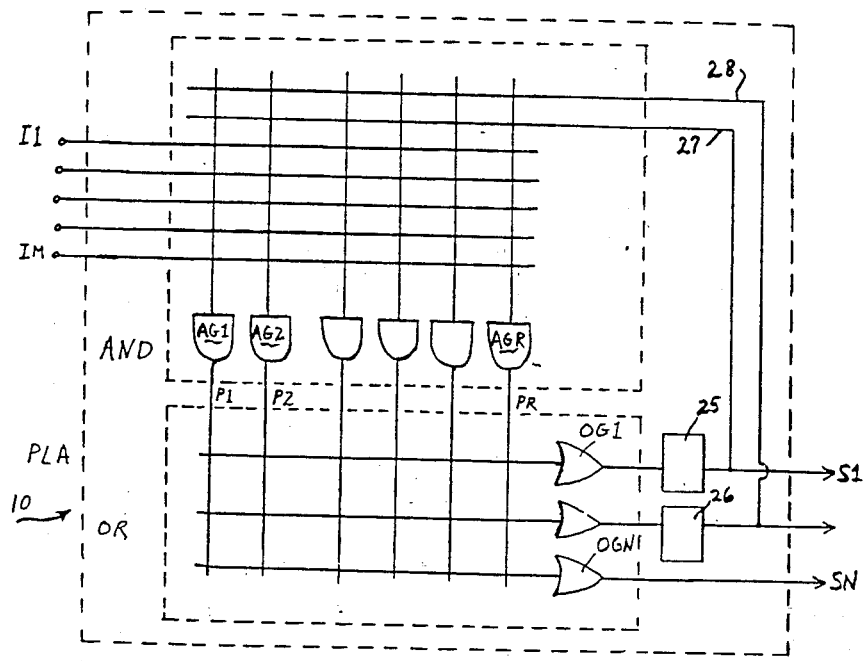
FIG. 1 is a diagram of a generalized prior art programmable logic array circuit.
Figure 2:
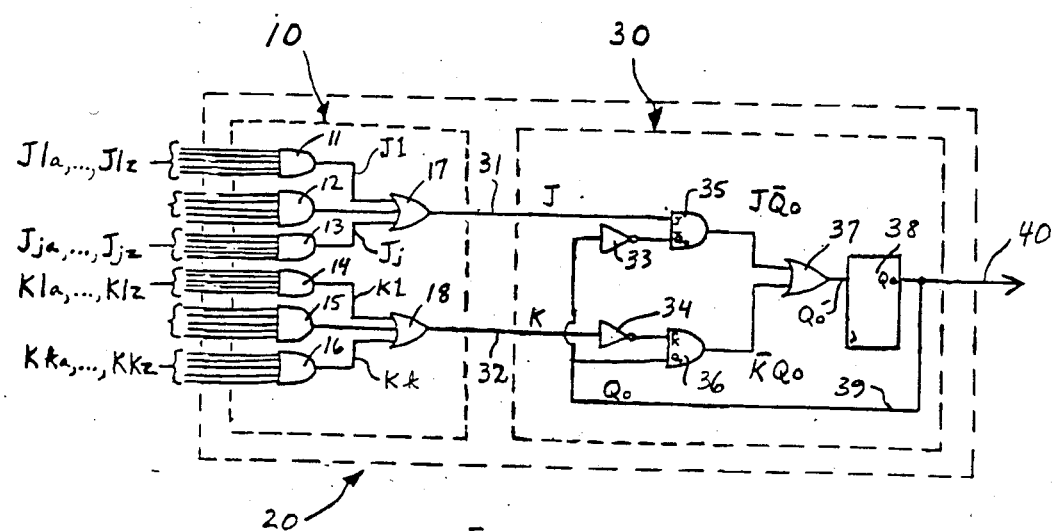
FIG. 2 is a diagram of a prior art JK flip-flop circuit driven by J and K signals which are sums of products provided by a prior art PLA circuit including a D-type flip-flop output register.
Figure 3:
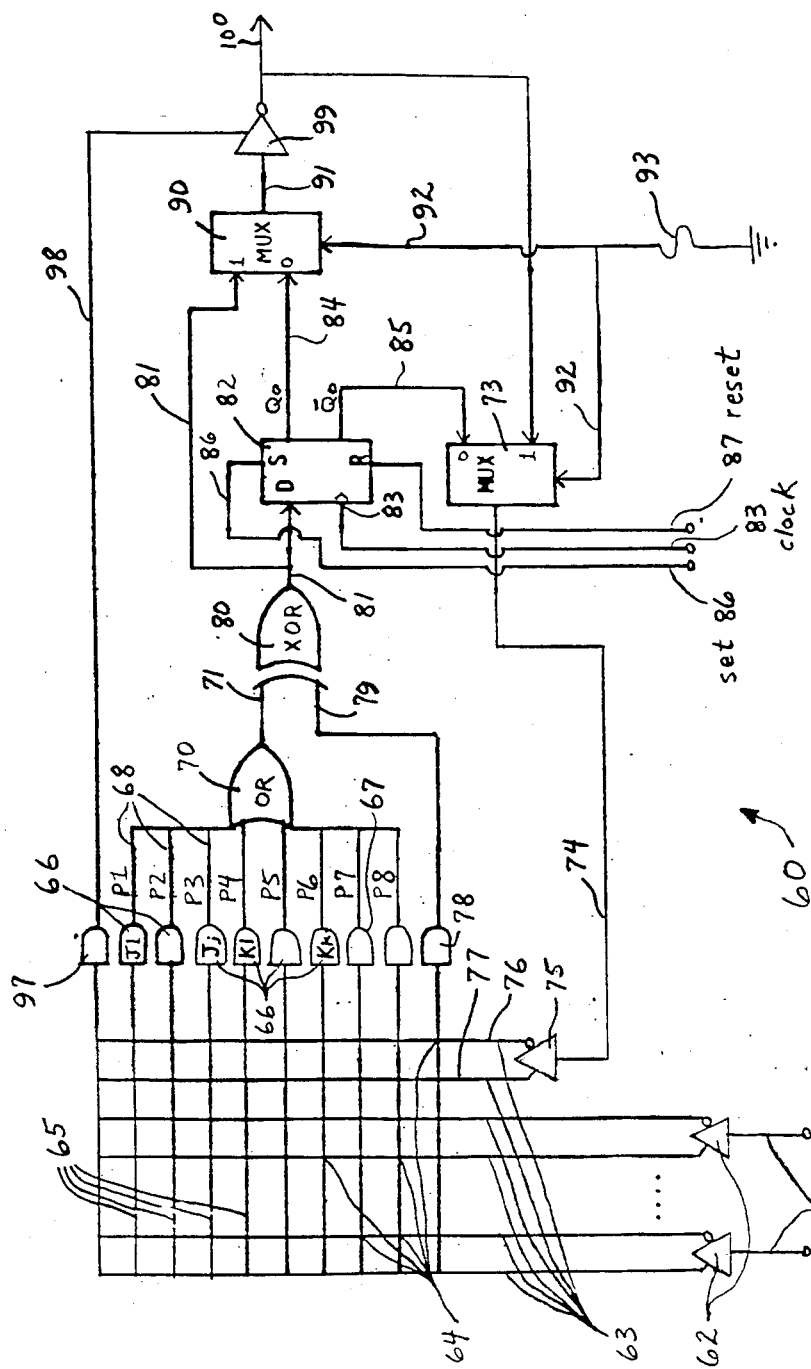
FIG. 3 is a logic device diagram of one embodiment of a programmable array logic cell according to this invention.

The programmable array logic circuit of this invention is shown in FIG. 3 in a preferred integrated circuit embodiment as cell 60. Details of the fabrication and B structure of conventional aspects of programmable array logic circuits are well known in the art. In one embodiment, cell 60 is mjsk-programmed during manufacture. In another embodiment, cell 60 is programmed after manufacture by blowing fuse connections, preferably titanium-tungsten links, although other satisfactory fuses are known.

Figure 4:
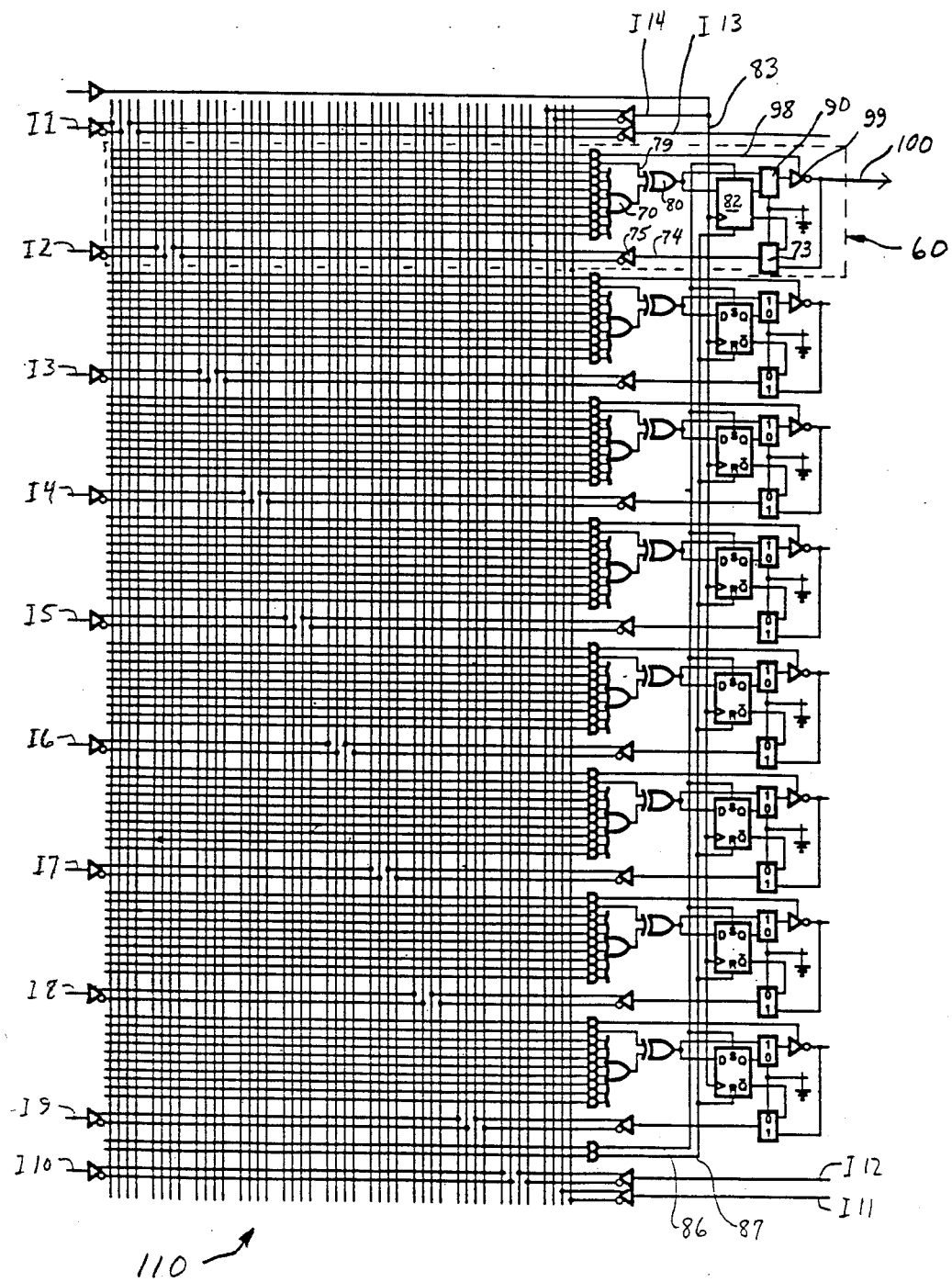
FIG. 4 is a schematic showing the cell of FIG. 3 embodied in a programmable array logic device with a total of eight cells.

Cell 60 is preferably embodied in an IC array device 110, FIG. 4, which includes a total of eight identical cells 60. Array 110 has 14 array input lines I1 through I14 or 61 which are connected through phase splitters 62 to provide 28 cell input lines 63 to each cell 60. In array 110 each of the eight cells 60 has its output signal coupled through a feedback line and a phase splitter, to provide another 16 cell input lines 63, for a total of 44 cell input lines 63 to each cell. For the sake of clarity, FIG. 3 shows only cell feedback input lines 76 and 77 from the feedback line 74 of the illustrated cell 60. AND plane input lines 63 are programmably connectable through fuses 64 to the input lines 65 of AND gates 66, 78 and 97. The sets of 44 input lines to each AND gate are, for the sake of clarity, shown in FIG. 3 as single lines 65.

AND gates 66 provide logical product terms P1 through P8 on respective product lines 68 to the input terminals of OR gate 70, from which a sum signal drives one input line 71 to XOR gate 80. The second input of XOR gate 80 is connected to output line 79 from AND gate 78, having input lines 65 programmably connectable to receive a signal from any combination of cell input lines 63, including for example the previous state output signal Qo or $\overline{Q}o$, as explained below.

The XOR gate 80 output signal Qo' on line 81 is applied to the data input terminal D of D-type flip-flop 82. Cell input line 83 provides a clock signal to the enable terminal of flip-flop 82. On rising edges of the enable signal, flip-flop 82 samples the data signal Qo' at its D input terminal, and transfers the data signal value to flip-flop output line 84 as signal Qo. Optional multiplexer (MUX) 90, controlled by the voltage on line 92 from programmable fuse 93, either, when fuse 93 is blown, selects line 81 for the Qo' signal pesently provided by XOR gate 80 for nonregistered output operation of cell 60 (as a Mealy type state machine) or, when fuse 93 is intact, selects flip-flop output line 84 for the Qo signal provided by XOR gate 80 during the previous period of the clock signal (for operation as a Moore type state machine). The signal (Q=Qo' or Qo) selected by MUX 90 is applied through line 91 to output buffer 99. AND gate 97 provides a control signal on line 98 to enable output buffer 99 to transfer the signal from line 91 to cell output line 100. When the signal on line 98 disables buffer 99, output line 100 floats at high impedance, and, if connected to feedback line 74, line 100 can be used as an input line 61 to cell 60.

For functions not requiring a previous state feedback signal on line 79, AND gate 78 can be used to force line 79 high or low and thereby control line 81 signal polarity. A high output signal can be forced from AND gate 78 by blowing all of gate 78 input line 65 fuse connections 64, allowing the disconnected lines 65 to float to the high supply voltage of cell 60, which is equivalent to a logical "true" input signal. A low output signal can be forced from AND gate 78 by leaving intact the fuses 64 between line 78 and both of the pair of complementary lines 63 from any phase splitters 62. A forced zero signal on line 79 disables XOR gate 80 so that, other than a one logic level delay, XOR gate 80 has no effect upon the capability of circuit 60 to perform functions not requiring an XOR gate. For the JK function, J and K input signals can be interchanged to control line 81 signal polarity.

Optional MUX 73, controlled by the voltage on line 92 from programmable fuse 93, either, when fuse 93 is intact, selects the inverting output line 85 from flip-flop 82, which provides the output signal inverse $\overline{Q}o$ to from the preceeding period of the clock or, when fuse 93 is blown, selects cell output line 100. If inverter 99 is supplied by MUX 90 with signal Qo from output line 84 from flip-flop 82, then MUX 73 supplies signal $\overline{Q}o$ from the preceeding period of the clock. Alternatively, if MUX 90 selects XOR output lead 81, then MUX 73 supplies the present signal $\overline{Q}o'$.

From MUX 73 output feedback line 74, the selected signal Q=Qo or Qo' applied to a phase splitter 75, which provides the line 74 signal and its inverse on cell input lines 76 and 77, respectively.

Any N array input lines 61 can be used for N-bit operation mode signals, to enable appropriate AND gates (66, 78, 97). Cell input line 63 connections 64 to AND gate input lines 65 are programmed to decode each combination of mode signals M and their complements to apply all 1's to enable appropriate AND gates to form products P of signals on other cell input lines 63. Any cell input lines 63 which are not used in any mode to provide a signal to a given AND gate are disconnected from that AND gate.

Cell 60 can be programmed or configured as a JK flip-flop using up to N=eight AND gates 66 to form respective products P1, ..., PN of subsets of up to 22 selected AND plane input signals and their complements for signals J1 through Jj and K1 through Kk. For a JK flip-flop, feedback line 76 providing signal Qo is program-connected to an input line 65 of feedback gate 78 and of each AND gate 66 used to form one of products K1 through Kk. Feedback line 77 providing signal $\overline{Q}o$ is program-connected to an input line 65 of each of the AND gates 66 used to find one of products J1 through Jj. Product terms J$\overline{Q}o$ and KQo are ORed together by OR gate 70 to form the sum J$\overline{Q}o$+KQo, which is applied on line 71 to the first input terminal of XOR gate 80. The previous output signal Qo is fed back through AND gate 78 and applied to the second input line 79 to XOR gate 80, which forms next state signal Qo':

$$Qo' = Qo \oplus [(P_1 + P_2 + \ldots + P_i)\overline{Q}o + (P_{i+1} + \ldots + P_8)Qo].$$

Cell 60 configured as a JK flip-flop is loaded with a data value D by using mode signals M, for example as shown in one of the sections of Table 3, appropriate to disable all AND gates 66 except for one J product gate 66 and one K product gate 66, to which D and $\overline{D}$ are applied, respectively. This reduces the flip flop function to $Qo' = Qo \oplus (\overline{Q}o * D + Qo * \overline{D}) = D$.

Other JK operations are executed by cell 60 using other mode signals M and data signals D as listed in Table 3. A logical 1 applied to enabled J gate input line(s) sets cell 60 to output signal $Qo' = 1$ or a logical 1 applied to enabled K gate input line(s) resets cell 60 to output signal $Qo' = 0$. Alternatively, logical 1 signals applied to optional control lines 86 or 87 set or reset flip-flop 82, respectively.

A logical 1 product term applied to input line 71 of XOR gate 80 toggles output line 81 signal Qo'. A logical 1 product on line 71 can be assured by applying logical 1's to all the input lines of at least one J product gate 66 and of at least one K product gate 66, or to a dedicated AND gate 67 selected by a toggle-mode signal.

When a logical 0 disabling signal is applied to at least one input 65 of each of AND gates 66, line 68 product terms are all logical 0, OR gate 70 provides a logical 0 sum signal on line 71, and the Qo' signal value on line 81 is held constant.

As an alternative example, cell 60 can be programmed for use as a counter in a bank of similar counter cells 60 (not shown) linked to carry each less significant cell 60 output signal Qo' to an input line 61 of the next higher significance bit-counting cell 60. Input signals M1, M2, and M3 are used as three bit mode signals arbitrarily assigned to designate eight operations to be performed upon other input signals Q, D, and their inverses, as shown in Table 2.

TABLE 2

| M3 | M2 | M1 | Operation |
|----|----|----|-----------|
| 0  | 0  | 0  | Load Data D3-D1 |
| 0  | 0  | 1  | Increment |
| 0  | 1  | 0  | Decrement |
| 0  | 1  | 1  | Clear to Zero |
| 1  | 0  | 0  | Set to One |
| 1  | 0  | 1  | Jump to 101 |
| 1  | 1  | 0  | Jump to 010 |
| 1  | 1  | 1  | Hold |

Mode signals M1, M2, M3 are decoded by the three cells 60 as listed in the following Table 3.

TABLE 3

| | | |
|---|---|---|
| Q1' = Q1 | $\oplus \overline{M3} * \overline{M2} * \overline{M1} * \overline{Q1} * \underline{D1}$ | Load D1 |
| | $+ \overline{M3} * \overline{M2} * \overline{M1} * Q1 * \overline{D1}$ | |
| | $+ \overline{M3} * \overline{M2} * M1$ | Increment |
| | $+ \overline{M3} * M2 * \overline{M1}$ | Decrement |
| | $+ \overline{M3} * \underline{M2} * M1 * Q1$ | Clear |
| | $+ M3 * \overline{M2} * \overline{M1} * Q1$ | Set |
| | $+ M3 * \overline{M2} * \underline{M1} * \overline{Q1}$ | Jump to 1 |
| | $+ M3 * \underline{M2} * \underline{M1} * Q1$ | Jump to 0 |
| Q2' = Q2 | $\oplus \overline{M3} * \overline{M2} * \overline{M1} * \overline{Q2} * \underline{D2}$ | Load D2 |
| | $+ \overline{M3} * \overline{M2} * \overline{M1} * Q2 * \overline{D2}$ | |
| | $+ \overline{M3} * \overline{M2} * M1 * Q1$ | Increment |
| | $+ \overline{M3} * M2 * \overline{M1} * \overline{Q1}$ | Decrement |
| | $+ \overline{M3} * \underline{M2} * M1 * Q2$ | Clear |
| | $+ M3 * \overline{M2} * \overline{M1} * Q2$ | Set |
| | $+ M3 * \overline{M2} * \underline{M1} * \overline{Q2}$ | Jump to 0 |
| | $+ \underline{M3} * \underline{M2} * \underline{M1} * \underline{Q2}$ | Jump to 1 |
| Q3' = Q3 | $\oplus \overline{M3} * \overline{M2} * \overline{M1} * \overline{Q3} * \underline{D3}$ | Load D3 |

TABLE 3-continued

| | |
|---|---|
| $+ \overline{M3} * \overline{M2} * \overline{M1} * Q3 * \overline{D3}$ | |
| $+ \overline{M3} * \overline{M2} * \underline{M1} * Q2 * Q1$ | Increment |
| $+ \underline{M3} * M2 * \overline{M1} * \overline{Q2} * \overline{Q1}$ | Decrement |
| $+ \overline{M3} * \underline{M2} * M1 * Q3$ | Clear |
| $+ M3 * \overline{M2} * \overline{M1} * Q3$ | Set |
| $+ M3 * \overline{M2} * \underline{M1} * \overline{Q3}$ | Jump to 1 |
| $+ M3 * \underline{M2} * \underline{M1} * Q3$ | Jump to 0 |

Such multi-cell counter can, for example, load, increment, decrement, clear, set, hold, or jump to, a value of Q. For the three bit counter to jump to the preselected value 101. the least significant bit counter 60 jumps to 1, the middle significance bit counter 60 to 0, and the most significant bit counter 60 to 1. Two product terms are used for the load mode code 000. The eighth code 111 for "hold" cannot be decoded. But if a mode signal equal to 111 is applied to mode input lines 61 to each cell 60, no other operation is decoded and the value of signal Qo from each cell is held.

Many other applications for the JK macrocell are envisioned. A preferred embodiment has been illustrated, of which modifications and adaptations within the scope of the invention will occur to those skilled in the art. The invention is limited only by the scope of the following claims.

We claim:

1. A programmable logic cell comprising:
   a plurality of logical AND gates, each gate having a plurality of input terminals and an output line;
   a plurality of cell input lines, selectively connectable to the input terminals of selected AND gates;
   a single logic OR gate having input terminals connected to selected AND gate output lines, and having an output line;
   a logical XOR gate having a first input terminal connected to the OR gate output line, having a second input terminal connected to an AND gate output line, and having an XOR output line on which the XOR gate provides a state signal;
   memory means to store the XOR output state signal;
   a cell output line coupled to the OR gate output line for providing a cell output signal; and
   feedback means selectively connectable to apply the state signal to selected AND gate input terminals.

2. A cell as in claim 1 further characterized in that:
   said memory means is a D-type flip-flop circuit having a data signal input termnal and an enable signal input terminal, and responsive to an enable signal to sample a Qo' next state signal value from the flip-flop data input terminal, and to provide the sampled signal value Qo' as present state signal Qo at a meory output terminal.

3. A cell as in claim 2 wherein the feedback means includes an inverse output terminal in the flip-flop which provides the state signal inverse $\overline{Q}o$, and includes phase splitter means which provide QQo and $\overline{Q}o$ on respective AND gate input terminals.

4. A cell as in claim 3 wherein the feedback means further includes a multiplexer having a first input terminal connected to the $\overline{Q}o$ output terminal of the flip-flop, a second input terminal connected to the cell output line, a control terminal connected through a programmable fuse to a reference potential, and an output terminal connected to provide signal Qo' to the phase splitter means.

5. A cell as in claim 3 further including a second multiplexer having a first input terminal connected to the flip-flop Qo output terminal, a second input terminal connected to the XOR gate output line, a control terminal connected through a programmable fuse to a reference potential, and an output terminal coupled to the cell output line.

* * * * *